(12) United States Patent
Chen et al.

(10) Patent No.: US 8,605,427 B2
(45) Date of Patent: Dec. 10, 2013

(54) HEAT DISSIPATION DEVICE UTILIZING FAN DUCT

(75) Inventors: Xiao-Zhu Chen, Shenzhen (CN); Lei Liu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 344 days.

(21) Appl. No.: 13/072,456

(22) Filed: Mar. 25, 2011

(65) Prior Publication Data

US 2012/0162917 A1    Jun. 28, 2012

(30) Foreign Application Priority Data

Dec. 28, 2010 (CN) .......................... 2010 1 0609125

(51) Int. Cl.
*H05K 7/20* (2006.01)
*F28F 7/00* (2006.01)
*H01L 23/34* (2006.01)

(52) U.S. Cl.
CPC .................................. *H05K 7/20145* (2013.01)
USPC ................. 361/679.49; 361/679.51; 361/697; 361/703; 165/80.3; 257/722; 174/16.3; 454/324

(58) Field of Classification Search
USPC ...................... 361/679.46–679.54, 688–723; 165/80.3; 257/712–713, 722; 174/16.3; 454/184, 324
See application file for complete search history.

(56) References Cited

U.S. PATENT DOCUMENTS

| | | | | |
|---|---|---|---|---|
| 6,155,920 | A * | 12/2000 | Pan et al. ...................... | 454/184 |
| 7,256,993 | B2 * | 8/2007 | Cravens et al. ................ | 361/690 |
| 7,262,964 | B1 * | 8/2007 | Barsun .......................... | 361/695 |
| 7,474,528 | B1 * | 1/2009 | Olesiewicz et al. ........... | 361/695 |
| 7,542,289 | B2 * | 6/2009 | Tsai et al. ...................... | 361/695 |
| 8,149,578 | B2 * | 4/2012 | Neumann et al. ............. | 361/690 |
| 8,353,746 | B2 * | 1/2013 | Tsai et al. ...................... | 454/284 |
| 8,395,892 | B2 * | 3/2013 | Li ............................. | 361/679.49 |
| 2010/0165568 | A1 * | 7/2010 | Tsai et al. ................ | 361/679.49 |

* cited by examiner

*Primary Examiner* — Zachary M Pape
(74) *Attorney, Agent, or Firm* — Altis Law Group, Inc.

(57) ABSTRACT

A heat dissipation device includes a heat sink and a fan duct. The fan duct includes a cover and a baffle. The cover includes a top plate, a first sidewall and a second sidewall respectively extending from opposite sides of the top plate. The baffle is located between the first sidewall and the second sidewall of the cover and pivotally contacts the first and second sidewalls. The baffle forms an angle with the top plate and is rotatable relative to the first and second sidewalls to adjust the angle between the baffle and the top plate.

14 Claims, 11 Drawing Sheets

HEAT DISSIPATION DEVICE UTILIZING FAN DUCT

BACKGROUND

1. Technical Field

The present disclosure relates to heat dissipation, and more particularly to a heat dissipation device using a fan duct.

2. Description of Related Art

Electronic devices such as central processing units (CPUs) generate considerable heat during operation, which can destabilize and damage the electronic devices.

A commonly used heat dissipation device includes a heat sink mounted on the CPU, a fan and a fan duct. The fan duct guides air flowing the fan through channels of the heat sink, providing cooling thereto. However, to conform to different electronic devices, different sizes of heat sinks are needed, with correspondingly different sizes of fan ducts, resulting in increased manufacturing costs.

It is thus desirable to provide a heat dissipation device which can overcome the described limitations.

BRIEF DESCRIPTION OF THE DRAWINGS

The components of the drawings are not necessarily drawn to scale, the emphasis instead being placed upon clearly illustrating the principles of the embodiments of the display device. Moreover, in the drawings, like reference numerals designate corresponding parts throughout several views.

DETAILED DESCRIPTION

Figure 1:
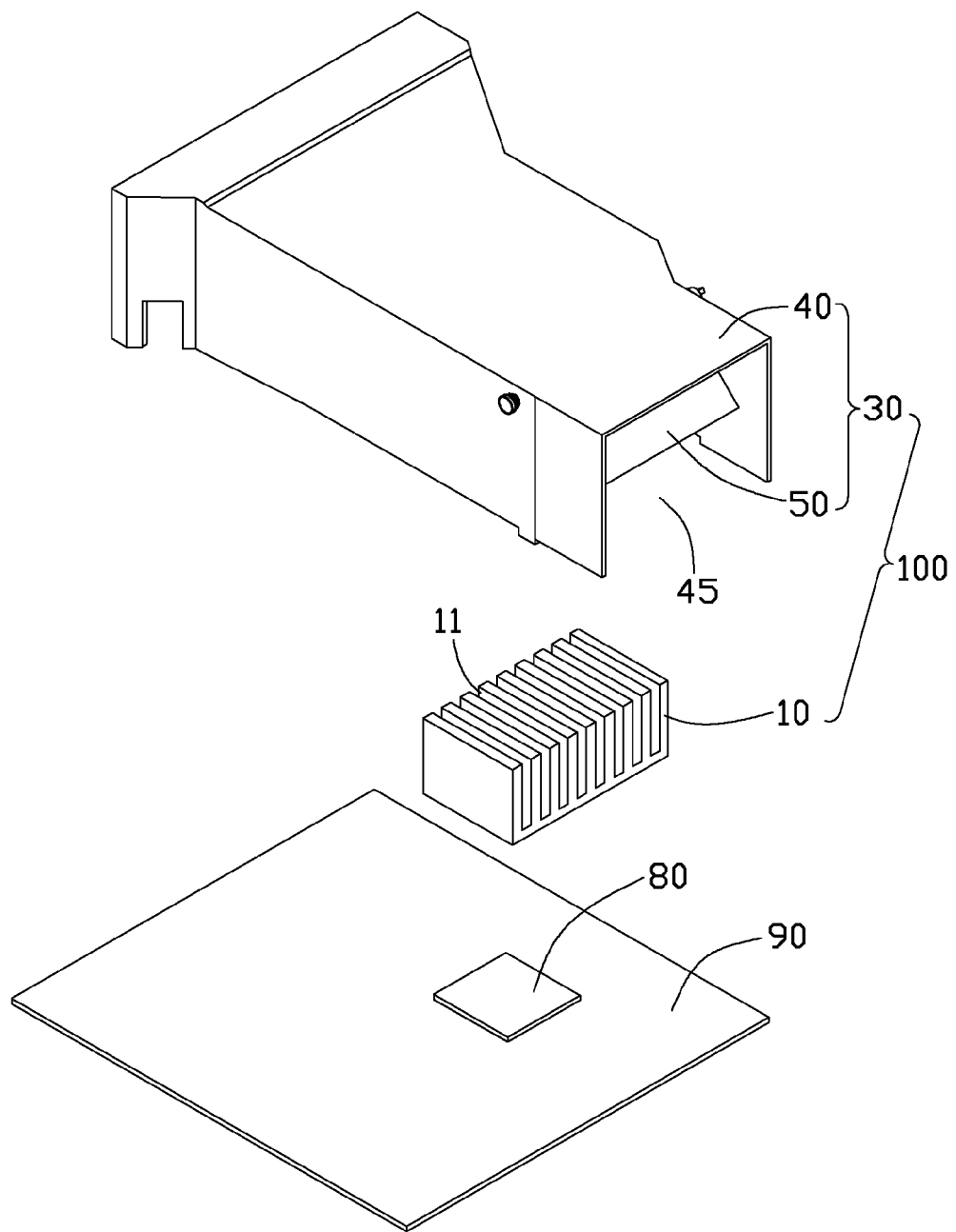
FIG. 1 is an isometric, exploded view of a heat dissipation device in accordance with an embodiment of the present disclosure, showing the heat dissipation device ready to be attached to an electronic component on a printed circuit board.
Figure 2:
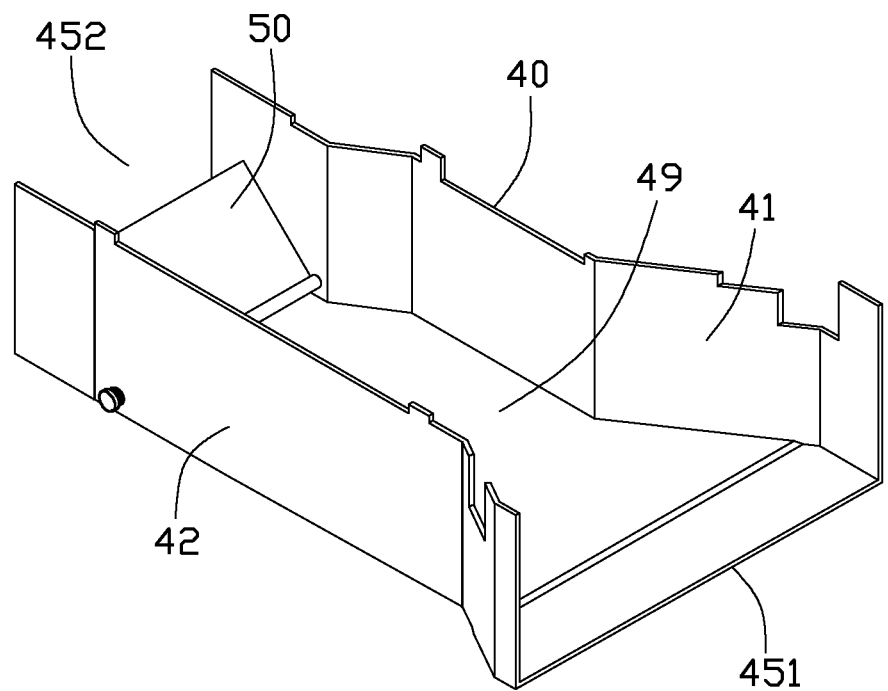
FIG. 2 is an isometric, assembled view of a fan duct of the heat dissipation device of FIG. 1, showing the fan duct inverted.

Referring to FIGS. 1-2, an electronic device (not labeled) including a heat dissipation device 100 is shown. The heat dissipation device 100 includes a heat sink 10, a fan duct 30, and a fan (not shown) mounted on the fan duct 30. The electronic device includes a printed circuit board (PCB) 90 and a central processing unit (CPU) 80 mounted on the PCB 90. The heat sink 10 is mounted on the CPU 80. The fan duct 30 is mounted on the PCB 90 and covers the heat sink 10. The fan duct 30 guides air flowing the fan through a plurality of channels 11 of the heat sink 10.

Figure 3:
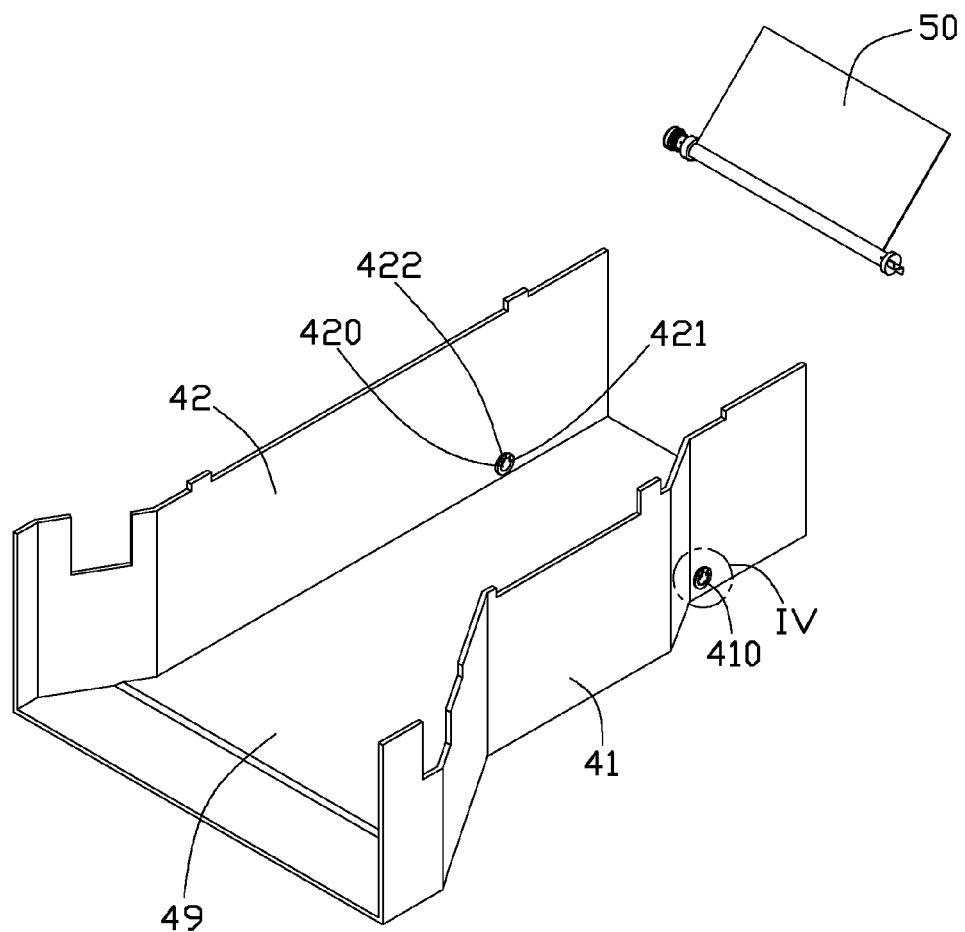
FIG. 3 is an exploded view of the fan duct of FIG. 2.
Figure 4:
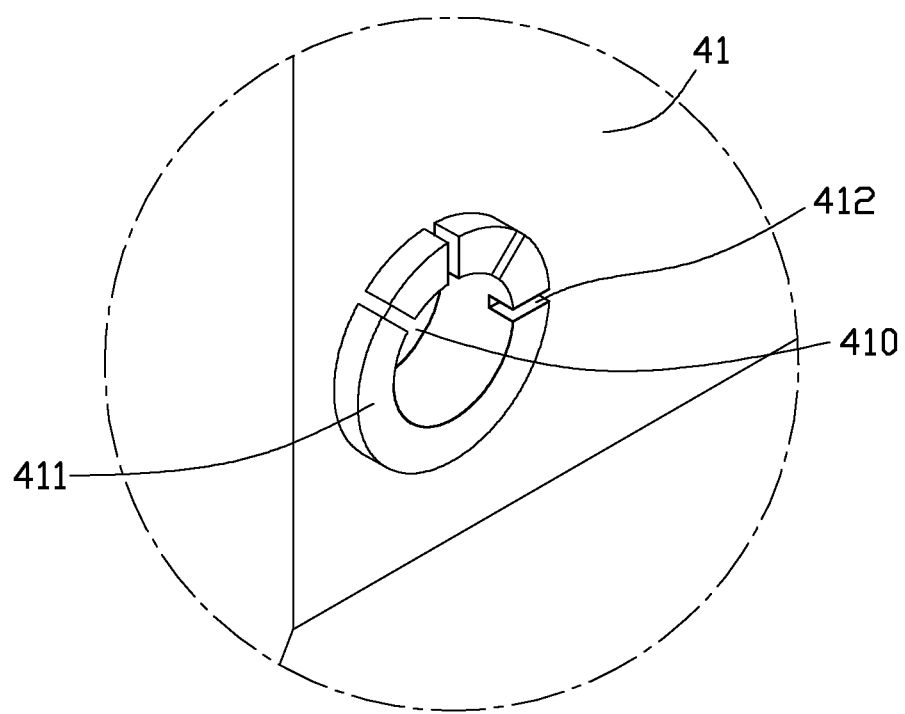
FIG. 4 is an enlarged view of a circled portion IV of FIG. 3.

Referring to FIGS. 3-4, the fan duct 30 includes a cover 40 and a baffle 50 received in the cover 40. The cover 40 includes a top plate 49 and a first sidewall 41 and a second sidewall 42 respectively extending from opposite sides of the top plate 49. The top plate 49, the first sidewall 41 and the second sidewall 42 together define a passage 45 to receive the heat sink 10. The channels 11 of the heat sink 10 are aligned with the passage 45. The passage 45 has an inlet 451 at an end of the cover 40 and an outlet 452 at an opposite end of the cover 40. In this embodiment, the heat sink 10 and the baffle 50 are located adjoining the outlet 452 of the cover 40.

The first sidewall 41 defines a pivot hole 410 thereon and the second sidewall 42 defines a pivot hole 420 thereon. The pivot holes 410, 420 are defined adjoining the top plate 49. An annular projecting portion 411 from an outer surface of the first sidewall 41 surrounds the pivot hole 410. The projecting portion 411 defines a plurality of spaced recesses 412 thereon. In the embodiment, four recesses 412 are divided into two sets. An annular projecting portion 421 extends around the pivot hole 420 from an inner surface of the second sidewall 42. The projecting portion 421 defines a plurality of spaced recesses 422 corresponding to the recesses 412.

Figure 5:
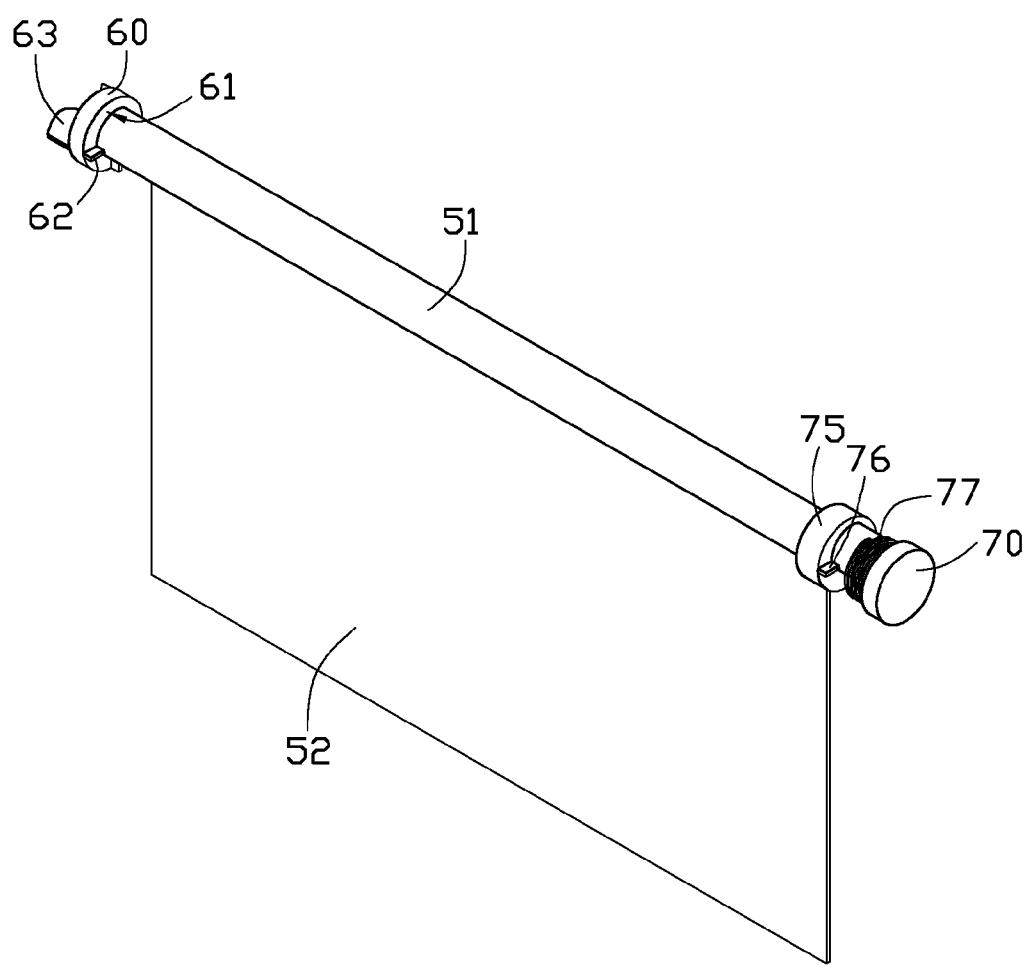
FIG. 5 is an assembled view of a baffle of the fan duct of FIG. 4.
Figure 6:
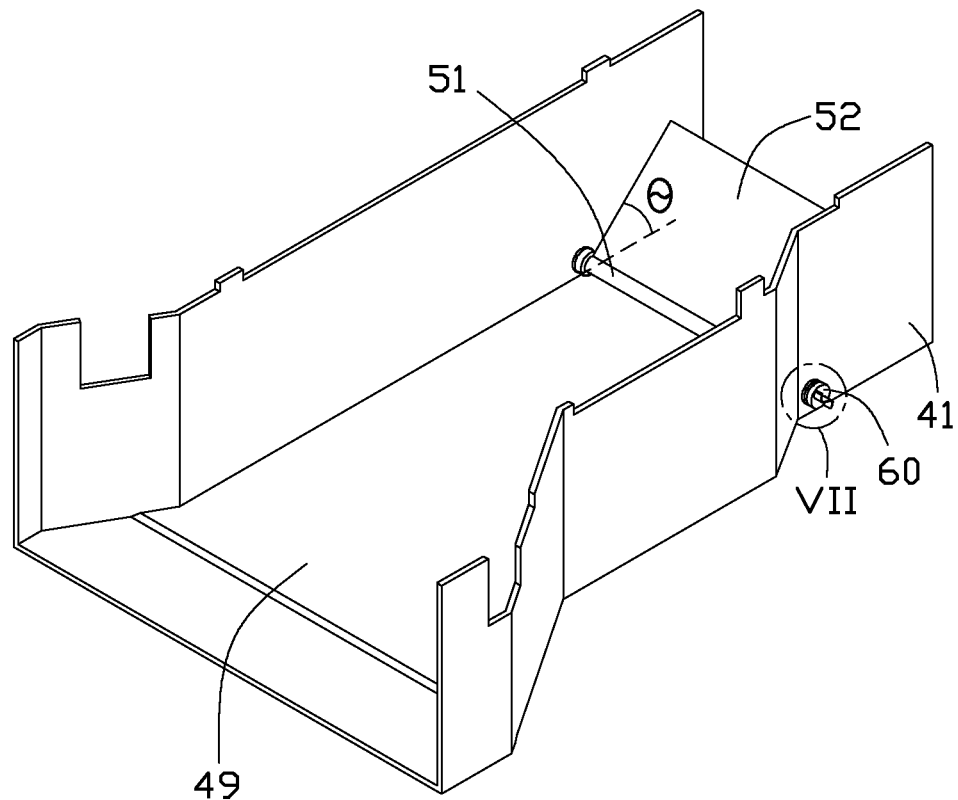
FIG. 6 is similar to FIG. 2, but shown from another aspect.
Figure 7:
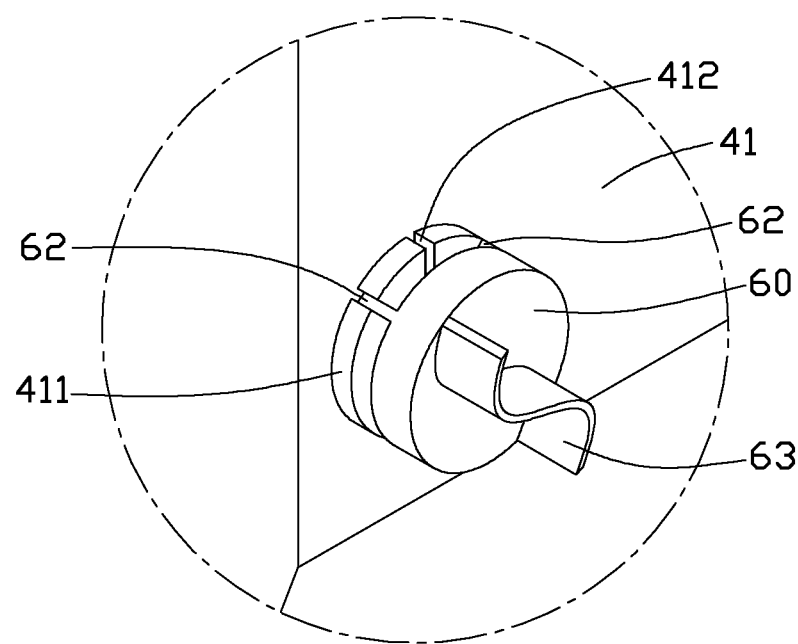
FIG. 7 is an enlarged view of a circled portion VII of FIG. 6.
Figure 8:
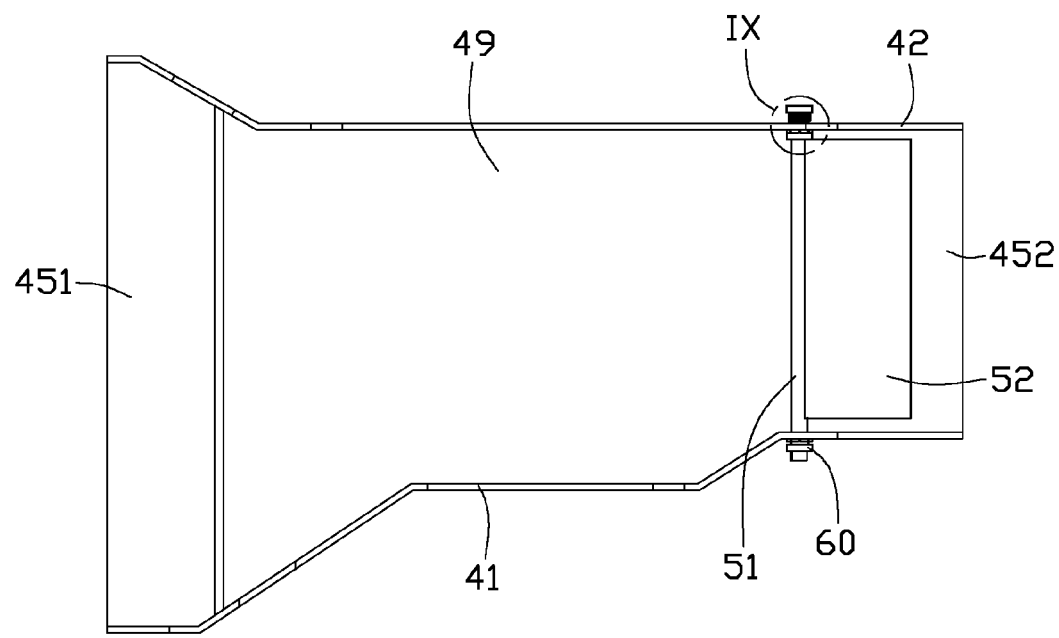
FIG. 8 is a top plan view of the fan duct of FIG. 2, wherein a baffle of the fan duct is located in a first position.
Figure 9:
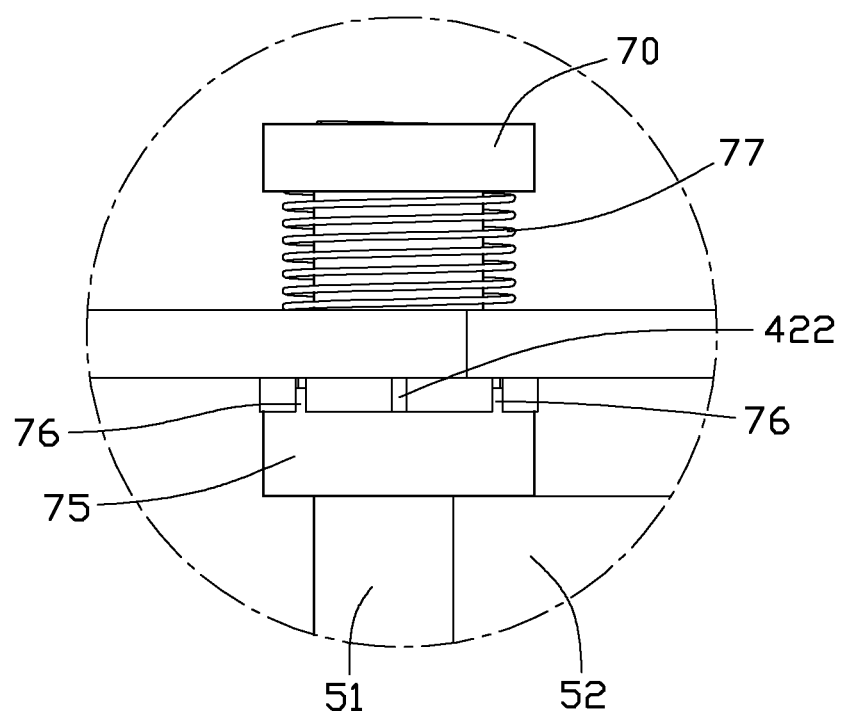
FIG. 9 is an enlarged view of a circled portion IX of FIG. 8.

Referring to FIG. 5, the baffle 50 includes an extending plate 52 and a shaft 51 formed at a top side thereof. The extending plate 52 has a rectangular profile. The shaft 51 has a first end (not labeled) pivotally received in the pivot hole 410 of the first sidewall 41, and a second end (not labeled) pivotally received in the pivot hole 420. The shaft 51 contacts an operating member 60 at the first end, and forms a blocking portion 70 at the second end. A diameter of the operating member 60 exceeds that of the shaft 51, whereby the operating member 60 defines an inner side surface 61 facing and spaced from the extending plate 52. Two protrusions 62 extends from the inner side surface 61 of the operating member 60. An S-shaped driving portion 63 extends from an outer side surface of the operating member 60. A diameter of the blocking portion 70 exceeds that of the shaft 51. A contact member 75 is mounted on the shaft 51 and positioned between the extending plate 52 and the blocking portion 70. The contact member 75 is mounted near the extending plate 52 and spaced from the blocking portion 70. The contact member 75 includes two protrusions 76 extending toward the blocking portion 70. An elastic member such as a spring 77 coils around the shaft 51.

Referring to FIGS. 6-9, the baffle 50 is mounted between the first sidewall 41 and the second sidewall 42 and near the outlet 452 of the cover 40. The shaft 51 is pivotally received in the pivot holes 410, 420 of the first sidewall 41 and the second sidewall 42. The operating member 60 and the blocking portion 70 respectively abut outer surfaces of the first sidewall 41 and the second sidewall 42. The spring 77 is sandwiched between the blocking portion 70 and the outer surface of the second sidewall 42 to impel the blocking portion 70 away from second sidewall 42 and force the protrusions 62 of the operating member 60 to be received in the first sidewall 41.

When the baffle 50 is in a first position, the baffle 50 of the fan duct 30 is mounted on the heat sink 10 on the CPU 80 of the PCB 90. The baffle 50 contacts a top of the heat sink 10 and defines an angle θ with the top plate 49. The protrusions 62 of the operating member 60 are received in two recesses 412 of the first sidewall 41 by the spring 77. Simultaneously, the protrusions 76 of the blocking portion 70 are received in two recesses 422 of the second sidewall 42. Alternatively, another elastic member (not shown) can be coiled around the shaft 51 and between the first sidewall 41 and the extending plate 52 to provide an axial force to push the baffle 50 away from first sidewall 41. The baffle 50 baffles air flowing through the fan duct 30 between the top plate 49 of the cover 40 and the top of the heat sink 10 and directs all air flowing toward the channels 11 of heat sink 10.

Figure 10:
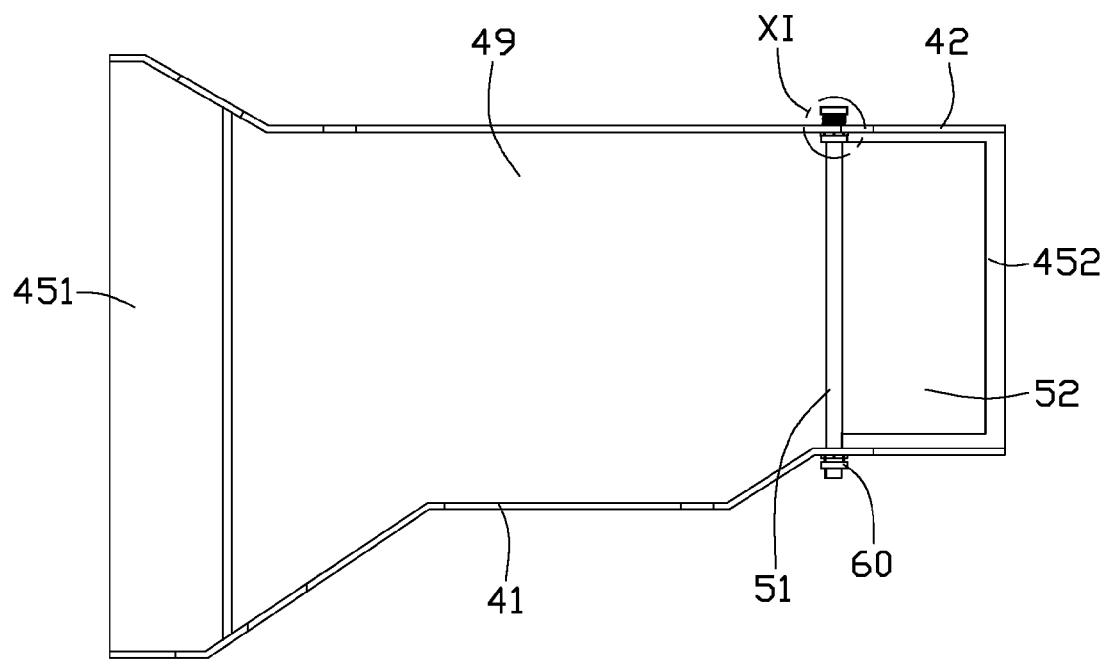
FIG. 10 is similar to FIG. 8, but showing the baffle of the fan duct located in the second position.
Figure 11:
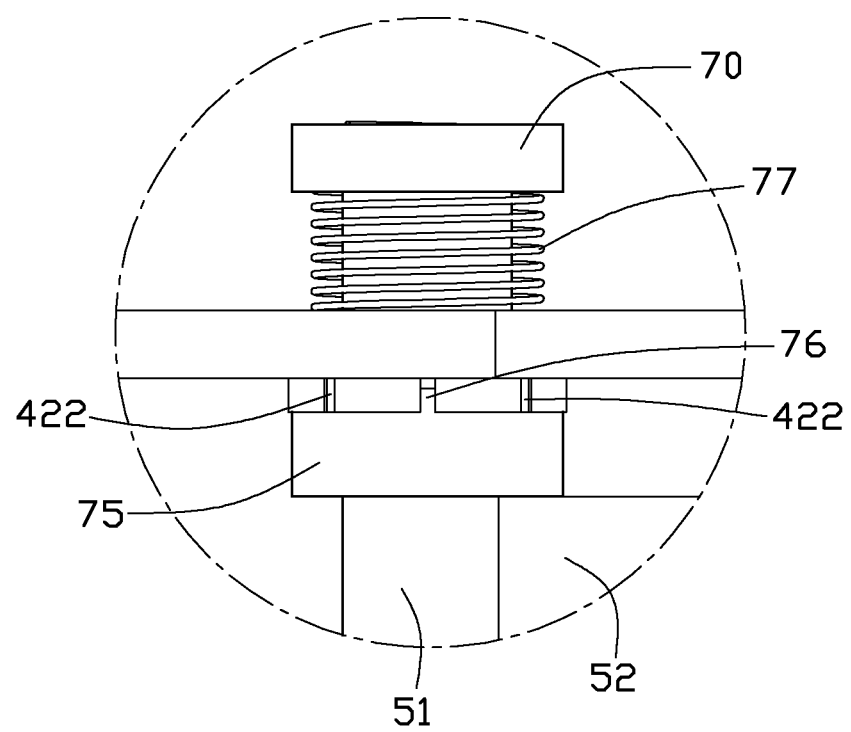
FIG. 11 is an enlarged view of a circled portion XI of FIG. 10.

Referring to FIGS. 10-11, when the CPU 80 (see FIG. 1) with the heat sink 10 presents a height different from that of the heat sink 10, the baffle 50 needs to be adjusted from the first position to a second position. In operation, the operating member 60 with the baffle 50 is pulled away from first sidewall 41, so that the spring 77 is compressed. At the same time, the protrusions 62, 76 are withdrawn from the recesses 412, 421 of the first sidewall 41. The shaft 51 of the baffle 50 is rotated to align the protrusions 62, 76 with other recesses 412, 421 of the first and second sidewalls 41, 42. Finally, force on the operating member 60 is released and the spring 77 relaxes, whereby the protrusions 62, 76 are received in other recesses 412, 421. The baffle 50 is firmly located in the second position where the baffle 50 is defined at a new angle with the top plate 49. In this embodiment, the extending plate 52 is parallel to the top plate 49 in the second position, thus the new angle is zero. Accordingly, when the fan duct 30 is mounted onto the new heat sink, the extending plate 52 contacts a top of the new heat sink to baffle air flowing between the top plate 49 and the top of the new heat sink.

It is to be understood, however, that even though numerous characteristics and advantages of the embodiment(s) have been set forth in the foregoing description, together with details of the structures and functions of the embodiment(s), the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat dissipation device comprising:
   a heat sink; and
   a fan duct comprising:
      a cover comprising a top plate, a first sidewall and a second sidewall respectively extending from opposite sides of the top plate; and
      a baffle received in the cover, the baffle pivotally engaged between the first and second sidewalls, the baffle forming an angle with the top plate and being rotatable relative to the first and second sidewalls to adjust the angle between the baffle and the top plate;
      wherein the baffle comprises a shaft adjoining the top plate of the cover, and an extending plate extending from a side of the shaft, the shaft having a first end pivotally received in the first sidewall and a second end pivotally received in the second sidewall; and
      wherein each of the first sidewall and the second sidewall defines a pivot hole therein to pivotally receive the shaft, the first sidewall defining a plurality of recesses surrounding the pivot hole in the first side wall, the first end of the shaft having at least a protrusion received in one of the recesses.

2. The heat dissipation device of claim 1, wherein the shaft contacts an operating member at the first end, and forms a blocking portion at the second end, the operating member and the blocking portion being located at outer surfaces of the first sidewall and the second sidewall, an elastic member, installed between the blocking portion and the second sidewall, coils around the shaft.

3. The heat dissipation device of claim 2, wherein the protrusion extending from the operating member to be received in one of the recesses.

4. The heat dissipation device of claim 2, wherein the second sidewall defines a plurality of recesses surrounding the shaft, at least a protrusion extending from the second end of the shaft to be received in one of the recesses.

5. The heat dissipation device of claim 4, wherein a contact member is mounted on the shaft and at an inner side of the second sidewall, the protrusion extending from the contact member.

6. The heat dissipation device of claim 2, wherein the elastic member is a spring.

7. The heat dissipation device of claim 1, wherein the heat sink defines a plurality of channels aligned along a direction of airflow, and the baffle baffles airflow between the top plate of the cover and the top of the heat sink.

8. An electronic device comprising:
   a printed circuit board (PCB); and
   a fan duct mounted on the PCB, the fan duct comprising:
      a cover comprising a top plate, a first sidewall and a second sidewall respectively extending from opposite sides of the top plate; and
      a baffle received in the cover, the baffle pivotally engaged between the first and second sidewalls, the baffle forming an angle with the top plate;
      wherein when a first electronic component with a first heat sink thereon is mounted on the PCB and is located under the baffle of the fan duct, the baffle is engaged on a top of the first heat sink in a first position; when a second electronic component with a second heat sink thereon is mounted on the PCB and is located under the baffle of the fan duct, and the second heat sink has a height different from that of the first heat sink, the baffle is rotatable relative to the first and second sidewalls to engage with a top of the second heat sink in a second position; such that the baffle baffles air flowing through the fan duct between the top plate and the top of the first heat sink or the second heat sink and directs at least part of such air flowing toward the first heat sink or the second heat sink;
      wherein the baffle comprises a shaft adjoining the top plate of the cover and an extending plate extending from a side of the shaft, the shaft having a first end pivotally received in the first sidewall and a second end pivotally received in the second sidewall; and
      wherein the shaft contacts an operating member at the first end, and forms a blocking portion at the second end, the operating member and the blocking portion being located at outer surfaces of the first sidewall and the second sidewall, an elastic member, installed between the blocking portion and the second sidewall, coils around the shaft.

9. The electronic device of claim 8, wherein the first sidewall defines a plurality of recesses surrounding the shaft, at least a protrusion extending from the operating member to be received in one of the recesses.

10. The electronic device of claim 8, wherein the second sidewall defines a plurality of recesses surrounding the shaft, at least a protrusion extending from the second end of the shaft to be received in one of the recesses.

11. A fan duct, the fan duct comprising:
   a cover comprising a top plate, a first sidewall and a second sidewall respectively extending from opposite sides of the top plate; and
   a baffle between the first sidewall and the second sidewall of the cover, the baffle pivotally engaged with the first and second sidewalls, the baffle forming an angle with the top plate and being rotatable relative to the first and second sidewalls to adjust the angle between the baffle and the top plate;

wherein the baffle comprises a shaft adjoining the top plate of the cover and an extending plate extending from a side of the shaft, the shaft having a first end pivotally received in the first sidewall and a second end pivotally received in the second sidewall; and wherein the shaft contacts an operating member at the first end, and forms a blocking portion at the second end, the operating member and the blocking portion being located at outer surfaces of the first sidewall and the second sidewall, an elastic member abutting the blocking portion and the second sidewall.

12. The fan duct of claim 11, wherein the first sidewall defines a plurality of recesses surrounding the shaft, at least a protrusion extending from the operating member to be received in one of the recesses.

13. The fan duct of claim 11, wherein the second sidewall defines a plurality of recesses surrounding the shaft, at least a protrusion extending from the second end of the shaft to be received in one of the recesses.

14. The fan duct of claim 13, wherein a contact member is mounted on the shaft and at an inner side of the second sidewall, the protrusion extending from the contact member.

\* \* \* \* \*